(12) United States Patent
Mondello et al.

(10) Patent No.: US 11,823,755 B2
(45) Date of Patent: Nov. 21, 2023

(54) METHOD AND DEVICE FOR SELF TRIMMING MEMORY DEVICES

(71) Applicant: Micron Technology, Inc., Boise, ID (US)

(72) Inventors: Antonino Mondello, Messina (IT); Alberto Troia, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/718,986

(22) Filed: Apr. 12, 2022

(65) Prior Publication Data
US 2022/0254425 A1 Aug. 11, 2022

Related U.S. Application Data

(63) Continuation of application No. 16/625,295, filed as application No. PCT/IB2019/000436 on May 31, 2019, now Pat. No. 11,309,045.

(51) Int. Cl.
*G11C 29/00* (2006.01)
*G11C 29/02* (2006.01)
(Continued)

(52) U.S. Cl.
CPC .......... *G11C 29/028* (2013.01); *G06F 3/0604* (2013.01); *G06F 3/0659* (2013.01);
(Continued)

(58) Field of Classification Search
CPC ... G11C 29/028; G11C 11/401; G11C 29/021; G11C 11/4074; G11C 11/4076; G11C 11/4097; G11C 11/4099; G11C 2029/0407; G11C 29/12; G11C 29/12005; G11C 29/46; G11C 29/787; G11C 5/025;
(Continued)

(56) References Cited

U.S. PATENT DOCUMENTS 6,888,765 B1 5/2005 Kotowski et al.
2013/0265841 A1* 10/2013 Duzly ............... G11C 5/14
365/228

(Continued)

OTHER PUBLICATIONS

Partial International Search Report and Provisional Opinion for related PCT Application No. PCT/IB2019/000436, dated Jan. 30, 2020, 17 pages.

(Continued)

*Primary Examiner* — Thong Q Le
(74) *Attorney, Agent, or Firm* — Brooks, Cameron & Huebsch, PLLC

(57) ABSTRACT

An integrated memory device can include an array of memory cells with decoding and sensing circuitry, a memory controller, read and write circuitry associated to the sensing circuitry, logic circuit portions in the read and write circuitry including at least a logic element receiving a data stream on a data input and a clock signal on a clock input, and a programmable or trimmable delay element or circuit upstream to the data input or the clock input for self trimming the internal timing of said at least a logic element by aligning in time the clock signal and/or the data stream. Operating parameters of the integrated circuit can be set for self trimming an internal timing of the integrated circuit.

19 Claims, 10 Drawing Sheets

(51) Int. Cl.
*G06F 3/06* (2006.01)
*G11C 7/22* (2006.01)

(52) U.S. Cl.
CPC ............ *G06F 3/0673* (2013.01); *G11C 7/222* (2013.01); *G11C 29/023* (2013.01)

(58) Field of Classification Search
CPC ......... G11C 5/063; G11C 5/145; G11C 5/147; G11C 29/023; G11C 7/222; G11C 11/406; G11C 11/4087; G11C 2029/1204; G11C 2207/104; G11C 2211/4013; G11C 2211/5641; G11C 29/006; G11C 29/02; G11C 29/50; G11C 29/50012; G11C 29/50016; G11C 29/83; G11C 7/1045; G11C 2029/0409; G11C 11/5628; G11C 11/5642; G11C 16/0483; G11C 16/30; G11C 16/32; G11C 29/022; G11C 29/42; G11C 29/52; G11C 5/14; G11C 5/143; G11C 7/00; G06F 3/0604; G06F 3/0659; G06F 3/0673; G06F 11/1004; G06F 11/1016; G06F 11/1028; G06F 11/1044; G06F 11/1012; G06F 11/1048; G06F 3/0614

USPC ....... 365/51, 222, 230.06, 189.05, 194, 227, 365/63, 200, 228, 230.03, 189.02, 189.09, 365/189.11, 190, 195, 196, 201, 202, 203, 365/205, 206, 207, 208, 226, 236; 711/154, E12.001, 170, 102, 103, 1, 111, 711/167, 171, 4, E12.002, E12.069
See application file for complete search history.

(56) References Cited

U.S. PATENT DOCUMENTS

2014/0129870 A1 5/2014 Lee et al.
2018/0189211 A1 7/2018 Zehavi et al.

OTHER PUBLICATIONS

International Search Report and Written Opinion for related PCT Application No. PCT/IB2019/000436, dated Apr. 6, 2020, 19 pages.

* cited by examiner

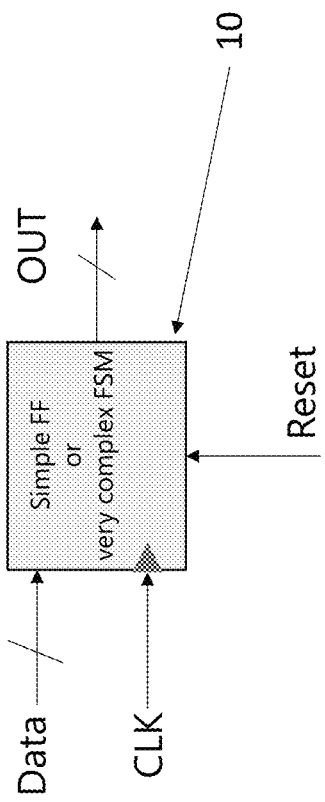
FIG. 1 – PRIOR ART

METHOD AND DEVICE FOR SELF TRIMMING MEMORY DEVICES

PRIORITY INFORMATION

This application is a continuation of U.S. application Ser. No. 16/625,295, filed Dec. 20, 2019, which is a National Stage Application under 35 U.S.C. § 371 of International Application Number PCT/IB2019/000436, filed on May 31, 2019, the contents of which are incorporated herein by reference.

TECHNICAL FIELD

The present disclosure relates to a method for setting operating parameters of an integrated circuit. More particularly, the present disclosure relates to a method for self trimming operating parameters and internal timing of an integrated memory device.

The present disclosure further relates to a non-volatile memory device having self trimming capabilities in wide temperature and wide voltage range applications.

BACKGROUND

One of the main problems in the operation of integrated circuits is to guarantee the functionality in all the process spread, supply and temperature variations.

For instance, any synchronous input addressed to the integrated circuit has a proper setup and hold time specification with respect to the clock input.

The setup time S is the amount of time (or a time interval) that data received at a synchronous input of a simple flip-flop circuit D must keep stable before the arrival of an active edge of a clock signal to allow the circuit to well catch such data. Similarly, the hold time H is the amount of time (or a time interval) that data received at a synchronous input of a simple flip-flop circuit D must keep stable after the arrival of the active edge of a clock signal.

The set up & hold parameters S and H must be set appropriately in order to let the integrated circuit working properly.

However, setup and hold are opposite parameters, in the sense better explained below; the high temperature usually makes slower both intervals while the low temperature render them faster; as a consequence, the two parameters will move accordingly in time.

A further parameter is given by the sum of the two intervals S+H=MPW that should remain stable before and after the clock input changes. This interval MPW has a minimum value allowed for a proper functioning, but this value can even be longer since the signal can remain stable waiting for the sampling and a sub-sequent change.

In any case, a violation of the setup and hold timing may generate, not just a single fail situation, but even some severe malfunctioning like the metastability of the flip-flop outputs that are undetermined and cannot be recovered unless forcing a reset or a power off and on.

The integrated circuits are designed and simulated keeping in mind the above problems, but for some applications it is not possible to guarantee the performance and the functionality in the assigned ranges, for instance in presence of great variations of supply, temperature and process ranges.

To attempt overcoming possible process spread some tests and trimming are done in factory; however, this common practice is time consuming because must be performed on each single IC; in other words, die per die.

BRIEF DESCRIPTION OF THE DRAWINGS

FIG. 1 is a schematic view of a simple bi-stable circuit receiving a data input and a clock input according to a known scheme;

DETAILED DESCRIPTION

Figure 1A:
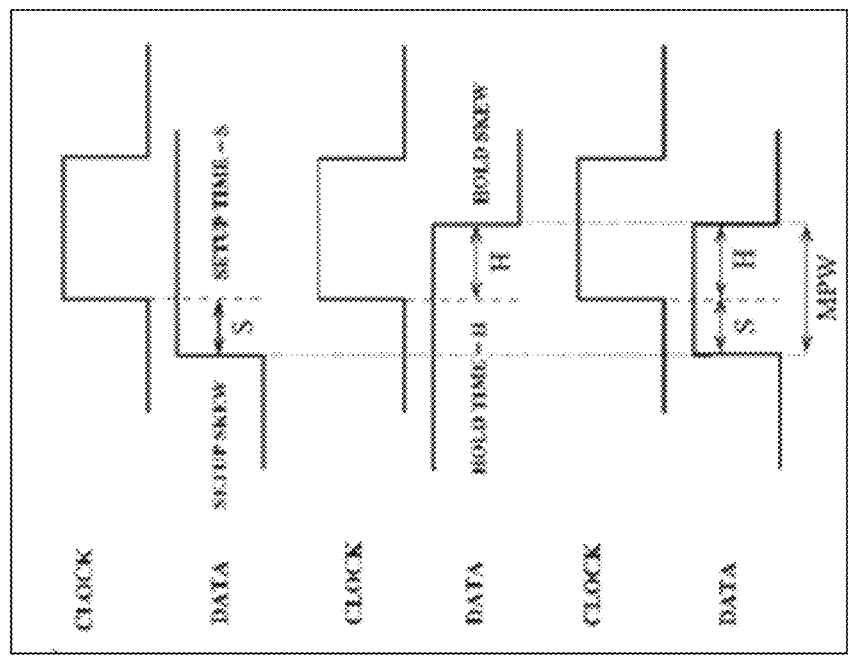
FIG. 1A is a comparative diagram showing the data setup and hold time periods compared with a known clock signal.

In the following detailed description, reference is made to the accompanying drawings that form a part hereof and in which is shown, by way of illustration, specific embodiments. In the drawings, like numerals describe substantially similar components throughout the several views. Other embodiments may be disclosed and structural, logical, and electrical changes may be made without departing from the scope of the present disclosure. The following detailed description is, therefore, not to be taken in a limiting sense.

The present disclosure relates to a method for setting operating parameters of an integrated circuit and, more particularly, for self trimming operating parameters and internal timing of a memory device as well as for helping the memory host in a fine setup of bus driver by optimizing the matching of impedance and timing.

Figure 2:
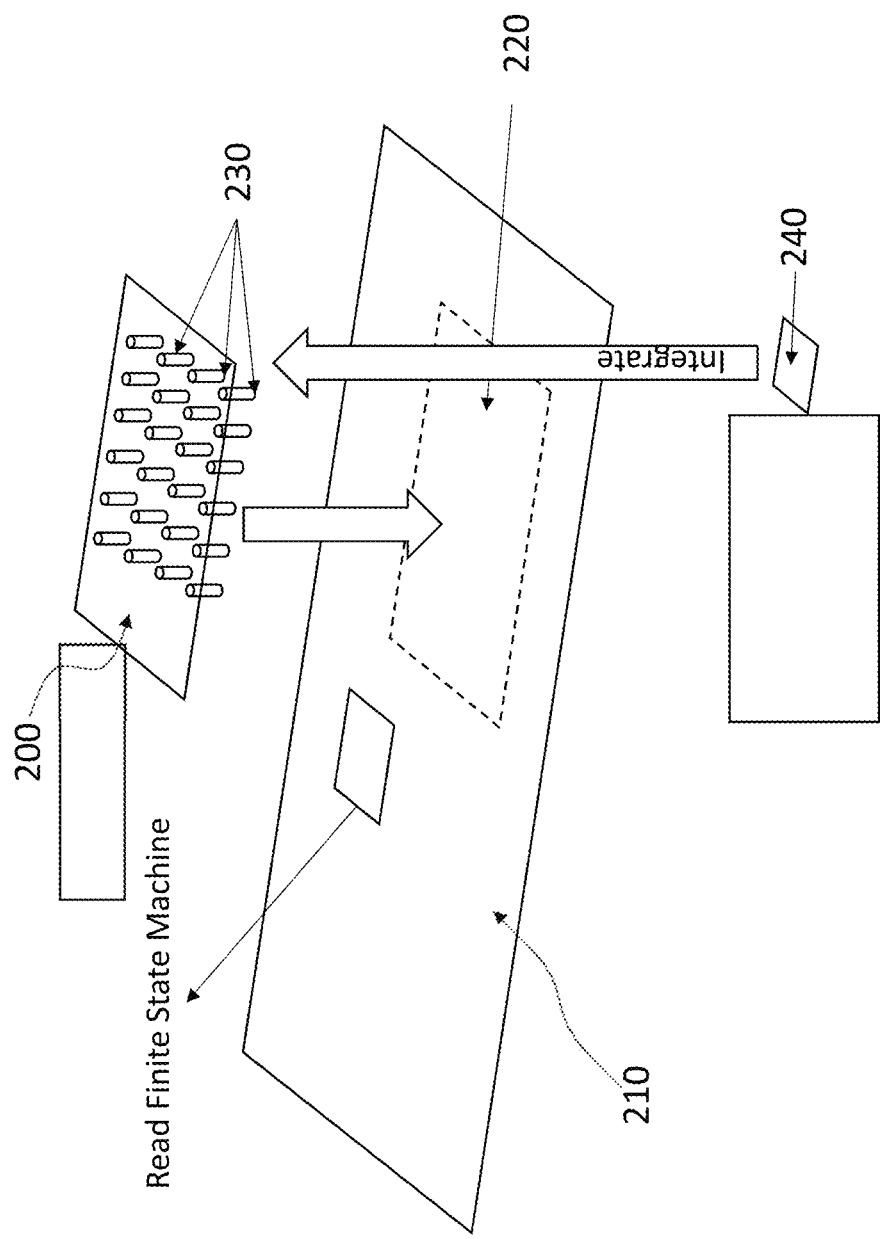
FIG. 2 is a schematic and perspective view of a System-on-Chip device with an associated memory device according to the present disclosure.
Figure 5:
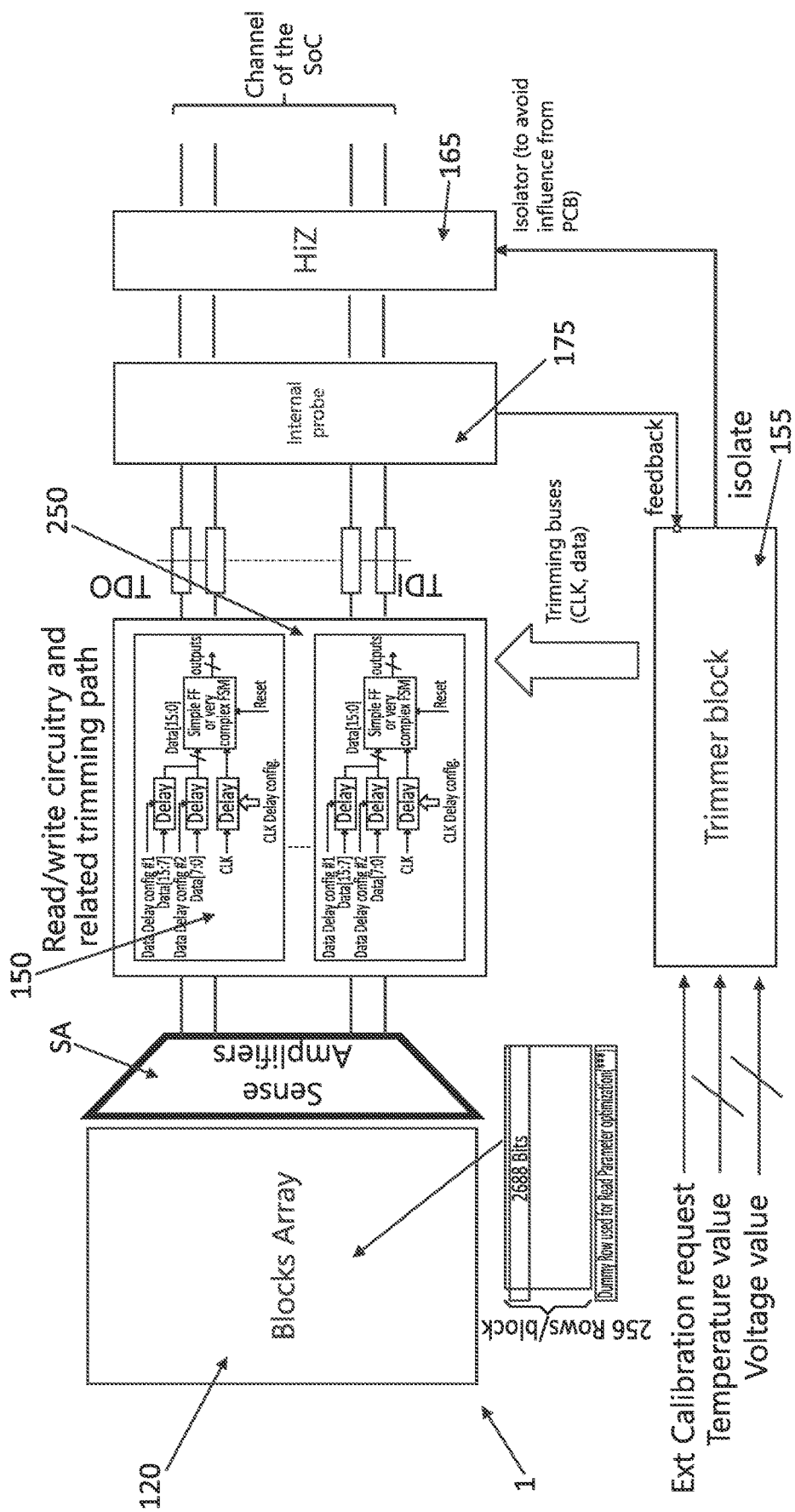
FIG. 5 is a schematic view of a portion an integrated memory device realized according to one embodiment of the present disclosure.

The memory device of the present disclosure is a non-volatile memory device or component indicated with the number 200 in FIG. 2 and with the number 500 in FIG. 5, respectively. Such a memory device 200 has been realized as an independent die with a specific lithography process and may be coupled to a host device or to a System-on-Chip though a communication channel. The host device can be a System-on-Chip with an embedded memory component or a more complex electronic device including a system coupled to a memory device, as will appear from the description of other embodiments of the present disclosure made with reference to other figures. In any case, the System-on-Chip and the memory device are realized on a respective die obtained by a different lithography process.

As an alternative the system may be an external controller in communication with the System-on-Chip but for the purpose of the present disclosure reference will be made to the host device or to the SoC as entities in communication with the memory component. For instance, the system 10 can be one of a number of electronic devices capable of using memories for the temporary or persistent storage of information. For example, a host device can be a computing device, a mobile phone, a tablet or the central processing unit of an autonomous vehicle.

Non-volatile memory can provide persistent data by retaining stored data when not powered and can include NAND flash memory, NOR flash memory, Read Only Memory (ROM), Electrically Erasable Programmable or trimmable ROM (EEPROM), Erasable Programmable or trimmable ROM (EPROM), and resistance variable memory such as phase change random access memory (PCRAM), self-selecting chalcogenide-based memories, resistive random access memory (RRAM), 3D XPoint memory (3DXP) and magnetoresistive random access memory (MRAM), among others.

A Flash memory is a type of non-volatile memory that retains stored data and is characterized by a very fast access time. Moreover, it can be erased in blocks instead of one byte at a time. Each erasable block of memory comprises a plurality of non-volatile memory cells arranged in a matrix of rows and columns. Each cell is coupled to an access line and/or a data line. The cells are programmed and erased by manipulating the voltages on the access and data lines.

As shown in FIG. 2, according to the present disclosure, the memory device 200 is removed from the SoC structure of the prior art thus allowing to use the corresponding semiconductor area for other logic circuits and for providing support for a structurally independent memory component 200 partially overlapping the SoC structure 210. The memory component 200 has a variable size depending on the size of the memory array included therein, which is manufactured according to the user's needs for instance in a range of values from 128 Mbit to 512 Mbit or more.

The removal of the embedded memory portion of the prior art has further the great advantage to free space, thus obtaining a semiconductor area 220 of the SoC structure 210 allowing the integration of additional user's function and/or reduce overall chip area.

The result of this solution is the new SoC structure of FIG. 2, strictly associated with the new structurally independent memory component 200 that is coupled to the SoC structure 210, for instance through a plurality of coupling elements 230, such as pillars, as well as through bumping balls, flip-chip technology, wireless interconnection (coils) and the like. In a preferred embodiment, the coupling elements are pillars, which are arranged in the semiconductor area 220 previously dedicated to an embedded memory portion.

In one embodiment of the present disclosure, the memory component 200 for the SoC structure 210 includes at least a memory portion and a logic circuit portion for interacting with the memory portion and with the SoC structure 210, wherein the memory component 200 is a structurally independent semiconductor device coupled to and partially overlapping the System-on-Chip structure 210.

A logic circuit 240 is integrated in the SoC structure 210 to cooperate with the logic circuit portion of the memory component 200.

The coupling between the SoC structure 210 and the memory component 200 is made by interconnecting a plurality of respective pads or pin terminals that are faced one toward the other in a circuit layout that keeps the alignment of the pads even if the size of the memory component 200 is modified.

In one embodiment of the present disclosure, the arrangement of the pads of the memory component 200 has been realized on a surface of the memory component 200. More specifically, the pads are arranged over the array so that, when the memory component 200 is reversed, its pads are faced to corresponding pads of the SoC structure 210. The semiconductor area 220 that in known System-on-Chip devices 210 was occupied by the embedded non-volatile memory portion is dedicated to the housing of the interconnecting pads corresponding to the pads of the memory component 200.

Even a memory component of a larger size may be supported and interconnected with the pads of the SoC structure 210, keeping the position and dislocation of its interconnecting pads.

In the contest of the present disclosure, the SoC structure 210 has its top side linked with the reversed side of the memory component 200, the pads of the SoC structure 210 being aligned with matching pads of the reversed memory component. As an alternative, the structurally independent memory component 200 may be coupled to the SoC structure 210 in a wireless manner. If a wireless coupling is adopted, a stack of memory components of the same size could be overlapped realizing a stack structure, wherein each independent component is addressed by the logic circuitry of the SoC structure 210 though a corresponding identification address.

The semiconductor area 220 previously occupied by the embedded memory portion is now used to implement additional functionalities and to prepare the semiconductor device for a Logic Over Pads technology. The expression "Logic Over Pads" means providing logic circuitry overlapping some connection pads located internally to a first or base layer represented by a complete semiconductor product, i.e. the SoC structure 210.

The memory component 200 thus represents an upper layer coupled and interconnected to the base SoC structure 210. The memory component 200 partially overlaps the SoC structure surface covering at least the semiconductor area 220 in the known solution occupied by an embedded memory portion. However, the memory component 200 has a greater capacity can cover a larger semiconductor area than the semiconductor area 220.

In this respect, the size of the overlapping memory component 200 is larger than size of the overlapped semiconductor area 220 dedicated to the interconnections with such covering memory component 200. In other words, the area of the overlapping memory component 200 is larger than the semiconductor area 220 of the SoC structure 210 dedicated to the interconnecting pads for the memory component 200.

Moreover, for a better functioning of the SoC structure 210, even a logic circuit portion normally incorporated in to the SoC and including a Finite State Machine or a RISC architecture can be removed and reorganized in association with the memory component 200.

Therefore, according to the present disclosure, a Modify Finite State Machine or RISC 240 has migrated into the memory component 200 for supporting the write and erase phases performed on the larger memory component 200.

The separation and optimization of the logic circuit portion further allows to enhance the functionality of the whole SoC structure 210, thus obtaining an independent semiconductor memory component 200 coupled to the SoC structure 210. This independent semiconductor memory component 200 therefore includes at least the memory portion (for example, a non-volatile memory portion) and the associated modify finite state machine 240, both incorporated into a semiconductor product that is coupled to the SoC structure 210. In this case, the memory logic in the SoC structure 210 is the one handling the memory interface communication.

In other words, both the non-volatile memory portion and the associated logic circuit portion are integrated in the independent semiconductor memory component 200 that is coupled and connected to the SoC structure 210.

According to embodiments of the present disclosure the memory device 200 is a non-volatile Flash memory type including at least the following components: an I/O circuit, a micro-sequencer including a control and JTAG logic and sense amplifiers.

The Flash memory device 200 further includes a command user interface CUI, voltage and current reference generators, charge pumps and decoding circuitry. The flash memory also includes an internal microcontroller for the erase and program algorithm execution.

It should be kept in mind that when coupling together two semiconductor integrated devices some problem may raise in handling the I/O signals between the two devices. What's more, if a controller is capable to work with a clock frequency signal reaching the value of at least one GHz (sometimes referred to as high frequency), other circuit portions, such as the associated memory component, have been designed to work at the lower frequency, for instance few hundreds of MHz (sometimes referred to as low frequency).

A typical situation of this kind arises for instance when a raising in temperature happens during the functioning of the system to whom the memory is associated. The memory component suffers for thermal drift and/or other drifts in power supply or voltage levels that limit its capability to operate according to the original set up values defined in the factory.

Another typical situation is the adaptation of the memory device to the host device (for instance a board where the memory device is mounted or the SoC where it is hosted). Such adaptation consists in the matching of impedance between memory output buffer and external bus and external signals skew. Such conditions could change during the life of the device because the external bus load could change (a new device is connected/disconnected, temperature variation, etc.

In order to solve these problems, that is to say: resetting the setup and hold durations for the internal FSM and regulating the impedance matching plus signal skews, some examples of the method according to the present disclosure will be considered. The method must be considered as implemented in an integrated circuit such as the memory device 200, for instance a memory device or component 200 coupled to a SoC 210.

Such an integrated memory device 200 includes a plurality of elementary circuit portions like a simple flip-flop, a latch or a logic gate.

It is well known that a simple Flip-Flop D, for instance like the known circuit shown in FIG. 1, can suffer for metastability. The data signals must be stable for a predetermined period of time before the raising edge of the clock signal to allow a proper data catching. Such a predetermined period of time is the so-called setup time S.

Moreover, as said before, a hold time H is the amount of time (or a time interval) that data received at a synchronous input of the simple flip-flop circuit D must keep stable after the arrival of the active edge of a clock signal.

FIG. 1 shows a schematic view of a Flip-Flop D 10 wherein the main block represents a simple logic gate receiving a data input DATA and a clock input CLK. A reset input Reset is further provided to reset the Flip-Flop D 10.

In this figure it is depicted a logic synchronous circuit with at least an input and an output. Data input/output are managed by a clock signal. Such circuit could be a simple latch or even a complex Finite State Machine but the picture is an example to introduce the setup/hold trimming that every synchronous circuit need.

Of course, the data input DATA is indicated in the symbol of the FIG. 1 with a plurality of digital values presented in parallel. In other words, the input terminal DATA is the head termination of a bus coming from a digital source.

Similarly, a data output OUT is shown with a corresponding plurality of digital output values.

It should be noted that the setup time S is defined for the simple flip-flop D 10 as well as for a more complex Finite State Machine including hundreds of flip-flops or logic gates.

A possible retrimming of the operation parameters would be highly desirable to avoid severe malfunctioning due to either possible metastability of the flip-flop or to a critical race in internal synchronous circuits. Most probably the valid window to capture the data will drift due to the intrinsic changes of the process, i.e. line resistance can change, capacitance can change, time constant will vary accordingly.

Moreover, other operative parameters may require a trimming after a lot of time of activity of the integrated circuit or due to possible reconfiguration/update of the board, where the memory is hosted, with new components that changes the impedances of the buses. For instance, the output impedance toward the System-on-Chip could require a similar re-trimming by selecting inside the output buffer one of the driver available that guarantee the impedance matching and then the best performances in terms of speed and shape of the voltage/current signals generated. While this trimming phase is suitable toward the output of the integrated circuit under examination, i.e. the memory device, the trimming of the setup and hold time intervals is focused on the internal activity of the integrated circuit.

According to some embodiments of the present disclosure, at least a programmable or trimmable delay element or circuit is employed, the programmable or trimmable delay element or circuit inserted upstream to the clock input and/or to the data input for tuning the relative distance between the data input and the active or front edge of the clock signal.

In other words, employing at least a programmable or trimmable delay element or circuit inserted upstream to the clock input and/or to the data input for tuning the relative distance between the data input and the active or front edge of the clock signal. This delay is added on the critical lines, i.e. clock, data, commands, FSM, etc. with the purpose to re-center all the signals affected by drift due to aging.

This trimming is done by feeding the FSM (or the circuit to be trimmed) with a sequence read from a nonvolatile area of the memory array checking then if the output of the FSM (or the circuit) matches with the expected values.

The trimming explores all the possible value of delay in order to obtain the widest range of functionality in around a particular condition (i.e temperature).

Moreover, also the output buffers of the memory device 200 are involved in the trimming operation and, more particularly, those buffers are handled as follows:

- a proper selection of the output buffer diver is performed in order to match the impedance between the memory buffer and the external bus as best as possible; and
- a proper trimming of the data path delays is performed in order to have the right skew between external clock and signals of the host device.

The above two procedures are performed adopting a special structure inside the output buffer.

In this more specific case the trimming is done by a reading phase using a standard data path stored in a special dummy row of a memory block. The external controller by measuring the quality of the read operation by using an eye diagram, then provide feedback to the device about the reading quality. The procedure is completed once the best setting is found.

Said differently, the clock and the data lines are re-aligned, and establish once again the operative conditions when the device was fresh or brand new from the factory. According to some embodiments, the setting of the programmable delay is changed to re-set the timing difference between the sampling clock signal and the sampling data signal.

According to one embodiment of the present disclosure it is disclosed a method for setting operating parameters of an integrated circuit, in particular for self trimming an internal timing of the integrated circuit including at least a circuit portion receiving at least a known data stream on a data input and a clock signal on a clock input, said method comprising:

- aligning in time the clock signal and/or the data stream by inserting an upstream programmable or trimmable delay element or circuit before one or both of said inputs.

Moreover, the phase of aligning in time comprises establishing the operative conditions when the integrated circuit was fresh or brand new from the factory.

- alignment in time is obtained by inserting a programmable or trimmable delay element or circuit upstream of said clock input to modify the relative distance between the data stream and the active or front edge of the clock signal.

The programmable or trimmable delay element or circuit is inserted on the clock signal path upstream with respect to the clock input.

As an alternative, the alignment in time is obtained by inserting a programmable or trimmable delay element or circuit upstream of said data input to modify the relative distance between the data stream and the active or front edge of the clock signal.

In this last case, the programmable or trimmable delay element or circuit is inserted on the data stream path upstream with respect to the data input. The above procedure can be performed at least a first time in factory at first use of the device and this can be done by using a testing machine. The found values are stored in a non-volatile register for future use.

In still another embodiment, the phase of aligning in time the clock signal and/or the data stream is obtained by programmable or trimmable delays upstream of both the data input and the clock input.

Another alternative in factory is to set all the delays with the indication that come from the design team and leave to the host fine tuning.

As an alternative, the setting phase is performed automatically, for instance at the reset of the integrated circuit.

As an alternative, the above procedure is performed on request of the host device, in other words according to a request specified by the System-on-Chip to whom the integrated circuit, i.e. the memory device, is associated.

As a further alternative, the above reported procedure is activated after receipt of warning signal produced by the host device, for instance after having detected a multifunction or a fail reading message of the memory device or if the host device detects a huge change of operating condition of the component for example a temperature increment/decrement.

Other alternative warning messages may be defined as starting point for activating the retrimming phase of the operating parameters of the integrated circuit.

For instance, in case it's necessary to trim the output impedance and/or buffer delay a specific event generating the request for retrimming the operating parameters is provided. For example, a load change on the I/O pins due to a board reconfiguration by the host, temperature changes and other possible change of operating conditions suggest to trim the buffer driver (for instance the selected one among the several available) and the data path delay for having to have the right skew between external signal and clock.

Figure 3:
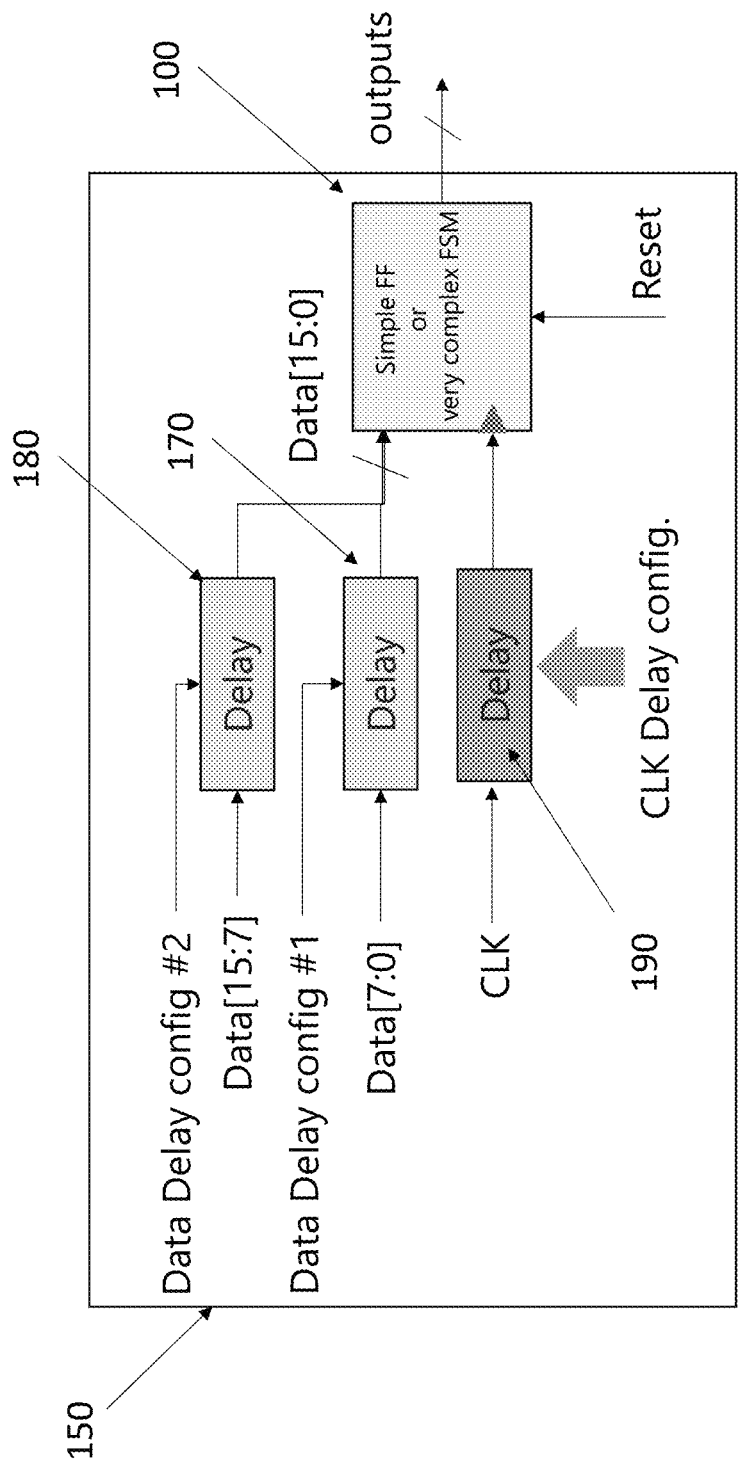
FIG. 3 is a block diagram of an example of logic circuit portion incorporated into an integrated circuit, i.e. a memory device, according to one embodiment of the present disclosure

In one embodiment of the present disclosure the setup time or the hold time can be tuned by changing the relative distance between data received by the data input terminal and the active edge of clock by inserting some trimmable delay element or circuit, as shown in FIG. 3. The Figure shown a schematic generic logic circuit portion 150 including at least a flip-flop 10, or a latch or even a complex FSM including at least a flip-flop, receiving on its inputs a data stream and clock signal.

Normally the delay is inserted into CLK path, but in some critical situation also on the data path is used, especially if the input bus is composed by signal coming from very different sources.

For instance, in one example a first delay is inserted into a first data stream while a second delay is inserted into a second data stream; the respective outputs of each delay block is summed to be applied to the data input of the component to be trimmed.

Each delay block is programmable or trimmable though a configuration command.

According to one embodiment of the present disclosure, disclosed for instance with reference to FIG. 3, a delay chain 190 is inserted on the clock signal path upstream with respect to the clock input CLK.

This delay chain is programmable or trimmable through a configuration signal CLK Delay config.

Moreover, at least another delay chain 170 is inserted on the data path upstream with respect to the data input DATA.

More specifically, a first delay chain 170 is inserted between a first digital data source and the data input DATA, for instance for a first group of eight Bit [0:7] while a second delay chain 180 is inserted between a second digital data source and the data input DATA, for instance for a second group of eight Bit [7:15].

The respective outputs of the first and second data stream are summed in a single data input for the digital DATA terminal of the flip-flop or latch 10.

Each of the delay chain is programmable or trimmable through a respective configuration signal: Data Delay config #1 and Data Delay config #2.

Figure 4:
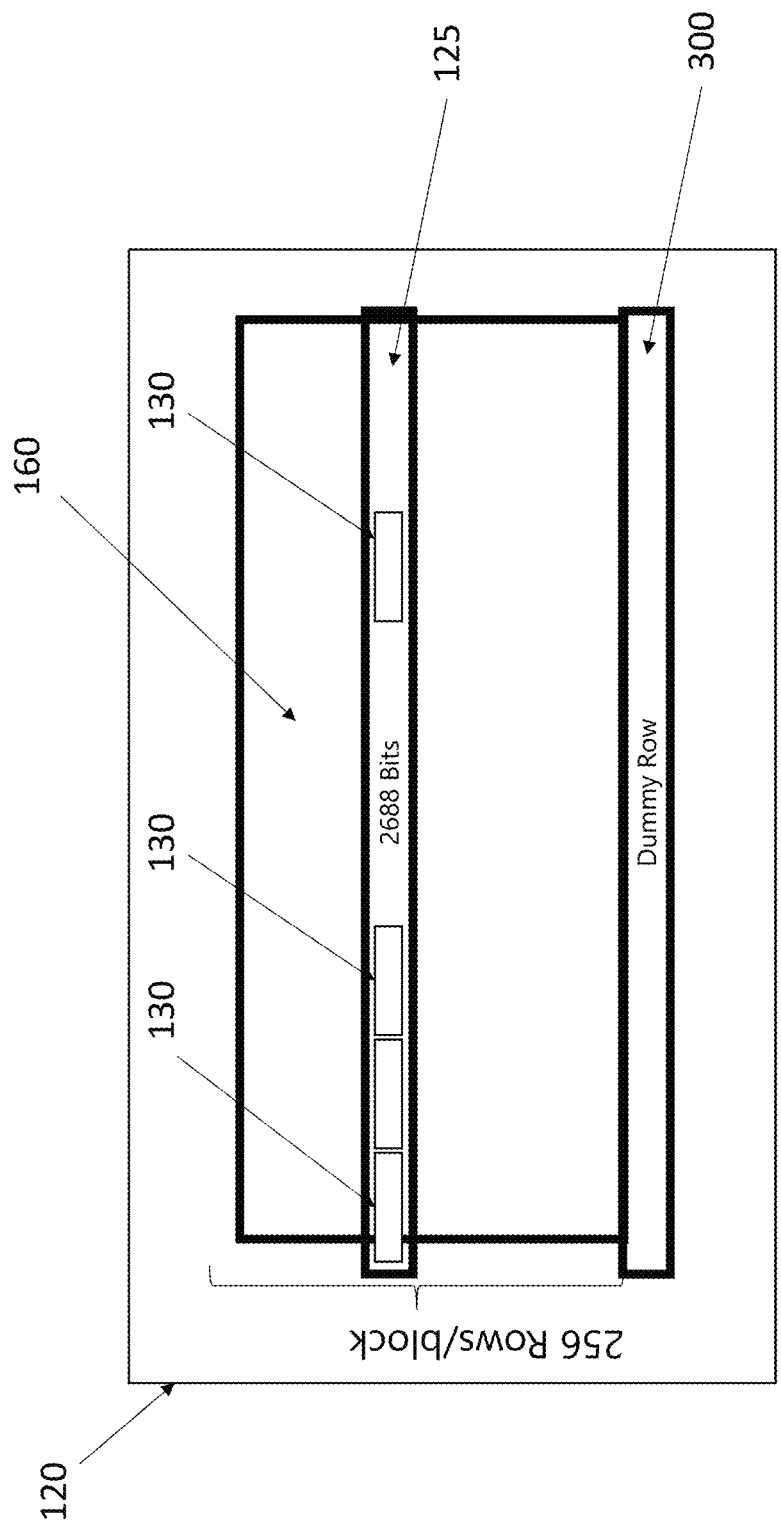
FIG. 4 is a schematic view of memory block formed by a plurality of rows of a memory array according to one embodiment of the present disclosure.

In one embodiment of the present disclosure the memory array is built as a collection of sub arrays 120 (shown in FIGS. 4 and 5). In this manner, having smaller sectors if compared to known solutions the access time is significantly reduced and the whole throughput of the memory component is improved.

Each sub array 120 is independently addressable inside the memory device 200. Each sub-array 120 contains multiple memory blocks 160, as depicted in FIG. 4.

In this manner, having smaller blocks or sectors 160 if compared to known solutions the access time is significantly reduced and the whole throughput of the memory component is improved. The reduction of the initial latency time is at block level because the row and column lines, the read path associated latency and the external communication have been optimized.

In the embodiments disclosed herewith the memory array is structured with a number of sub-arrays 120 corresponding to the number of cores of the associated SoC and, therefore to the number of corresponding communication channels. For instance, at least four memory sub arrays 120 one for each communication channel with a corresponding core of the SoC are provided.

The host device or the System-on-Chip normally includes more than one core and each core is coupled to a corresponding bus or channel for receiving and transferring data to the memory device 200.

Therefore, in the present implementation each sub-array 120 has access to a corresponding channel to communicate with a corresponding core of the System-on-Chip. The outcome of the memory blocks is driven directly to the SoC without using high power output buffers and optimizing the path.

The advantage of this architecture is that it is very scalable, wherein expanding and/or reducing the density of the final device translates only in mirroring a sub-array and generating the connection or increasing the number of blocks of each subarray, that is the available density per core.

Each sub array 120 is independently addressable inside the memory device 200. Moreover, each memory array is structured with at least four memory sub arrays 120. This is the form factor for this device, but it can be different in other technologies and/or application. As said, it contributes to the low initial latency, matching the final words processed in the SoC in this specific application In one embodiment of the present disclosure the output of a sub-array 120 is formed combining the following sequence: data cells plus address cells plus ECC cells. The total amount of Bits may involve 168 pads per channel in the implementation disclosed herewith.

Moreover, as shown schematically in FIG. 4, each memory sub array 120 is structured in memory block 160. The architecture of the memory block 160 comprising each location of the memory array may be defined as super page. In embodiments of the present disclosure each independently addressable location of the blocks 160 of each memory sub array 120 addresses an extended page 130 that will be named defined hereinafter with the term super page.

Said differently, the atomic page of 128 bits used in each sub-array 120 to fill the communication channel with the SoC device has been enlarged to contain the stored address and the ECC.

As non-limiting example, this extended page 130 comprises a string including a first group of at least one-hundred-twenty-eight (128) Bit for the I/O data exchange with the SoC device plus at least a second group of twenty-four (24) address Bit and a final or third group of at least sixteen (16) ECC Bit. The twenty-four (24) address Bit are sufficient to address up to 2 GigaBit of available memory space.

According to the present disclosure, the outputs of the sense amplifiers SA prepare a double extended page at a time, i.e. a super-page 130 comprising a number of Bits given by the double combination of the above-mentioned three groups of data bits, address bits and ECC bits, according to the size of the memory array.

In the specific but non-limiting example disclosed herewith each extended page 130 includes at least 168 Bit obtained by the combination of the above three groups of 128+24+16 data, address and ECC Bit and each super-page is formed by a couple of extended pages, i.e. a group of 168×2 Bits.

Just to give a non-limiting numeric example, each row 125 of a memory block 160 includes sixteen extended pages. Therefore, the resulting row includes 2688 Bit coming out from the combination of sixteen extended pages independently addressable and each including 168 Bit or, said differently, the combination of eight super-pages.

The combined string of data cells+address cells+ECC cells allows implementing the whole safety coverage of the bus according to the standard requirements, because the ECC covers the whole bus communication (data cells+address cells), while the presence of the address cells provide the confidence that the data is coming exactly from the addressed location of the controller.

Therefore, each row 125 includes at least sixteen pages comprising a memory word plus the corresponding address Bits and the corresponding ECC Bits. Obviously, another size may have selected and the reported value are just for illustration purpose of a non-limiting example.

For completeness sake it should be noted that according to one embodiment of the present disclosure illustrated in FIG. 4 a dummy row or line 300 is associated to each block 160 of the memory sub array 120.

This dummy row 300 is located outside the address space of the memory array and is used for the optimization of the trimming parameters. This dummy line is inserted to monitor the cell drift and at the same time to store the optimum settings for different operating corners.

A main purpose of this dummy row 300 is that of tracking the temperature, voltage and process variations. In this manner it is possible to set-up parameters to perform read and write operation inside the array depending on the optimum settings stored in dummy row.

The dummy row 300 contains a known pattern for the memory controller of the memory device 200.

In fact, a comparison between the expected data and content of the dummy row 300 can provide information about the changes to bring to the trimming parameters.

In this manner it is possible to optimize the read operation that happens at different temperature, voltage or process values.

To offer this possibility different pattern values of trimming parameters are recorder for each different temperature or voltage degree in a programmable or trimmable register. In other words, different reading voltage values are recorded in such a programmable or trimmable register for performing the reading phase at different temperature or voltage conditions and by changing the trimming parameters.

Doing so, it is possible to detect and to compare a known reference pattern at different temperature or voltage values. This known reference pattern is stored in the internal memory micro-controller. The controller knows the addresses of this known reference pattern and may perform a fine tuning of the read internal trimming till the optimum corner is found. At this point, the controller will use the information contained in this row or in another location where the memory contains the "best" possible trimmings for the reading and writing phases.

Just to make a specific example for a better understanding of the present disclosure, let's suppose to record in the dummy row 300 a known value like 0x55 in hexadecimal form. This value is particularly suitable since it includes the same amount of "0" logic values and "1" logic values.

Since that value is known a priori, the system will perform some reading cycles changing the trimming parameters up to the moment wherein the value will be read correctly. The changed trimming parameter of the correct reading will correspond to a set temperature value or to a set voltage value recorded in the programmable or trimmable register.

Only when the read trimmed parameters perfectly corresponds to the correct reading of the known value the reading phase of the other portions or sectors of the sub array 120 may be performed.

Said differently, the use of a known string of data stored in the special dummy row 300 of an array block 120 is useful for comparing quickly a current reading with a reference reading phase.

There is no real need to store the above known value in predetermined operating conditions since the pattern is known to the internal controller and also its address. Therefore, the controller can make a sweep of the trimming parameter till this pattern is read with the best possible margin. At this point the best possible corner is found and the internal controller will use these settings for the other operations.

The controller will need an additional check only if some data read with the possible optimum trimming are starting to show a high ECC. This event can indicate that the operating conditions are changed and a retrimming phase will be needed.

With the knowledge this known string it is possible to set a calibration pattern for the setup and hold time intervals as well as for other parameters to be periodically trimmed.

The special information stored in the dummy row 300 are read during a calibration phase and are read with very relaxed timing so that they are not affected by possible problems in detecting the setup and hold time intervals.

On a particular event, i.e. temperature, reference voltage (Vdd) changes, or on user request, the known pattern stored in dummy row 300 is read and the internal calibration algorithm starts to trim the configuration in order to obtain the best performance and avoid any metastability.

Optionally, the integrated circuit can have the capability to store in the above-mentioned programmable or trimmable register, for instance a look-up table, the parameters obtained at each trimming in order to reuse them in the future occasions once the same or similar conditions may happen.

So, the controller of the integrated memory device may check if a similar environment situation has already happened before calculating a new trimming. If a previous situation is detected by the positive result of a comparison between the data retrieved from the programmable or trimmable register and the data stored in the reference dummy row 300, then this indication may be used as starting point for looking a new fine trimming.

As an alternative, the retrieved information may be used per se for a subsequent trimming phase due to no computation time available since urgent operation are ongoing.

In any case, the detection of the necessity of a retrimming operation permits to speed-up and optimize the tuning process.

Making now more specific reference to the example of FIG. 5, a trimmer block 155 has been provided inside the memory device 200 as the core of the trimming methodology.

This block 155 receives at its input at least a value representative of the operation Temperature, as well as information about the reference voltage Vdd level. Those signals may come from the outside world, meaning from outside the System-on-Chip or an external device.

Moreover, one input can be an external calibration request.

The trimmer block 155 is also structured for computing internally both the inside temperature and the Vdd information, with inside detectors.

The digital output of the trimmer block 155 is represented by a trimming bus to a plurality of internal circuits indicated by a generic block 150. This block is indicated as inserted between the outputs of the sense amplifiers of a memory array the output buffers. This block 150 provides the clock and data to perform the trimming operation. When this trimming operation is performed the I/O are disconnected to isolate the memory during this sort of calibration sequence. In the meanwhile, the block 175 called "probe" performs the proper comparison between the data from the array and the data from the trimming block.

The schematic view of FIG. 5 shows read and write circuitry at the output of the sense amplifiers SA representing logic circuits 150 wherein a setup and hold time interval must be periodically trimmed. The delay trimming usually are in another block that contains the global configuration of the device.

The data contained in this block 150 are trimmed for sense amplifiers and analog circuit that needs to work properly to use the memory device.

These parameters can be block dependent since the data stored, including the dummy pattern 0x55 previously disclosed, can be written at whatever corner.

It should also be considered that an erase phase of the array block 120 will delete the "dummy row" 300 and its content. It should always be performed a storing operation before the erasing phase to save the optimum settings somewhere else in the memory and restore it afterwards.

The golden pattern (i.e. the stored 0x55 value) is not needed since the internal memory controller knows the location and the content. Second important consideration the erase of this block can happen in any corner and this implies the need to have special optimum parameters restored and then read with the optimum values found using the above-mentioned algorithm.

The example of FIG. 3 is referring to the delay configuration that usually are stored in factory in a special configuration block, intrinsic in the device.

What it is important is a correct reading of the known content of the dummy row 300 so that all the variation for reading correctly that content at the actual environmental conditions are indicative of the trimming regulation that is necessary to bring the parameters in condition for resetting the setup and hold time intervals. As previously said, the delay trimming is written in a configuration block for the whole memory and it is stored once in factory. Clearly, this methodology may be applied, but the erase will never be performed and the optimum settings can be shared with the regular array block when the eye-diagram is analyzed and the opt point is found.

As said before, the delay trimming is stored in a configuration block, for instance the block 160. Each of the memory sub-array 120 (or blocks 160, depending on the implementation) can contain the dummy row 300 to store the golden pattern and analog/digital calibration parameters. Therefore, the trimming buses at the output of the trimmer block 155 are active on the data and clock inputs of the logic circuits to regulate and configure the delay blocks disclosed with reference to FIG. 3 and to allow a self-trimming of the memory component intended as the integrated circuit needing a periodical trimming.

Usually the memory array and the trimming blocks must be isolated from the external world to ensure that the trimming is not affected by noise coming from the I/O lines. In this respect, upon receipt of a user request, the trimmer block starts working providing a specific output command for an isolator block 165 HiZ.

First of all the trimmer 155 isolates the extern of PCB by activating the isolator 165, for instance by forcing the HiZ block 165 to operate as output buffer.

Secondly, the check of the 0x55 value allows finding the optimum trimming. As soon as the trimming parameters are found, the look-up table is addressed to load all the proper settings. The proper settings can contain also data to perform the write and erase phase that have been selected because they will come together with the optimum parameters found during the 0x55 exploration and comparison.

The trimming using the 0x55 will always point to valid settings in the look-up table. The reason is due to the fact that these settings are factory selected and they must cover the whole operating range of the memory.

If nothing is available (or such feature is not present) the trimming is started from scratch and the optimization algorithm is activated.

In this respect, the optimization algorithm operates according to the following procedure:

the special information row is read (even several times) to build the eye-diagram and then select the best settings for the operating point where the memory is being used;

the trimmer block 155 contains the golden pattern. The reason is that the golden pattern has to be re-written all the time the sub-array and/or block and/or group of sub-arrays are erased.

The write phase of the golden pattern is performed by the flash memory controller at the end of the erase operation. Mainly, the end of the erase will be the golden pattern writing and the recovery of the optimum parameters from the local storage area and/or copying it from another similar block with a dummy row.

The trimmer block asks for a read operation on the special dummy row but with a standard timing (or with the best condition knowing for the particular Temperature/Vdd condition). The standard timings usually are default low speed/safe parameters. In any case, the trimming block knows the pattern in the controller so the operation, even for a high memory array speed due to the Direct Memory Access of the SoC 210, can be performed. The memory logic will perform several read of the golden pattern stored, varying the read parameters, to find out the best ones.

Figure 6:
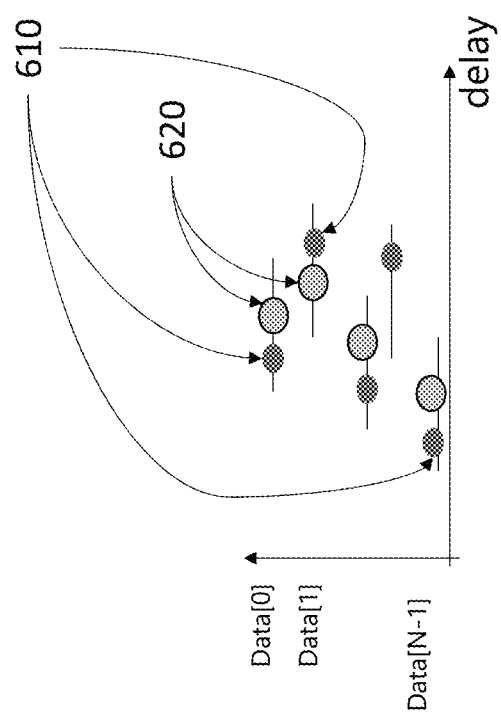
FIG. 6 is diagram showing the selection points of a trimming procedure performed by an optimization algorithm used according to the present disclosure.

If no timing is available, the trimmer uses the best parameters available from the design process. The algorithm is implemented to find out the optimum opening of the eye diagram shown in FIG. 6; that is to say: the reading phase is performed using step by step all the possible configurations, the read is compared to understand how good is from the golden one. At the end of the operation, the eye diagram is checked and the optimum setting selected.

Figure 7:
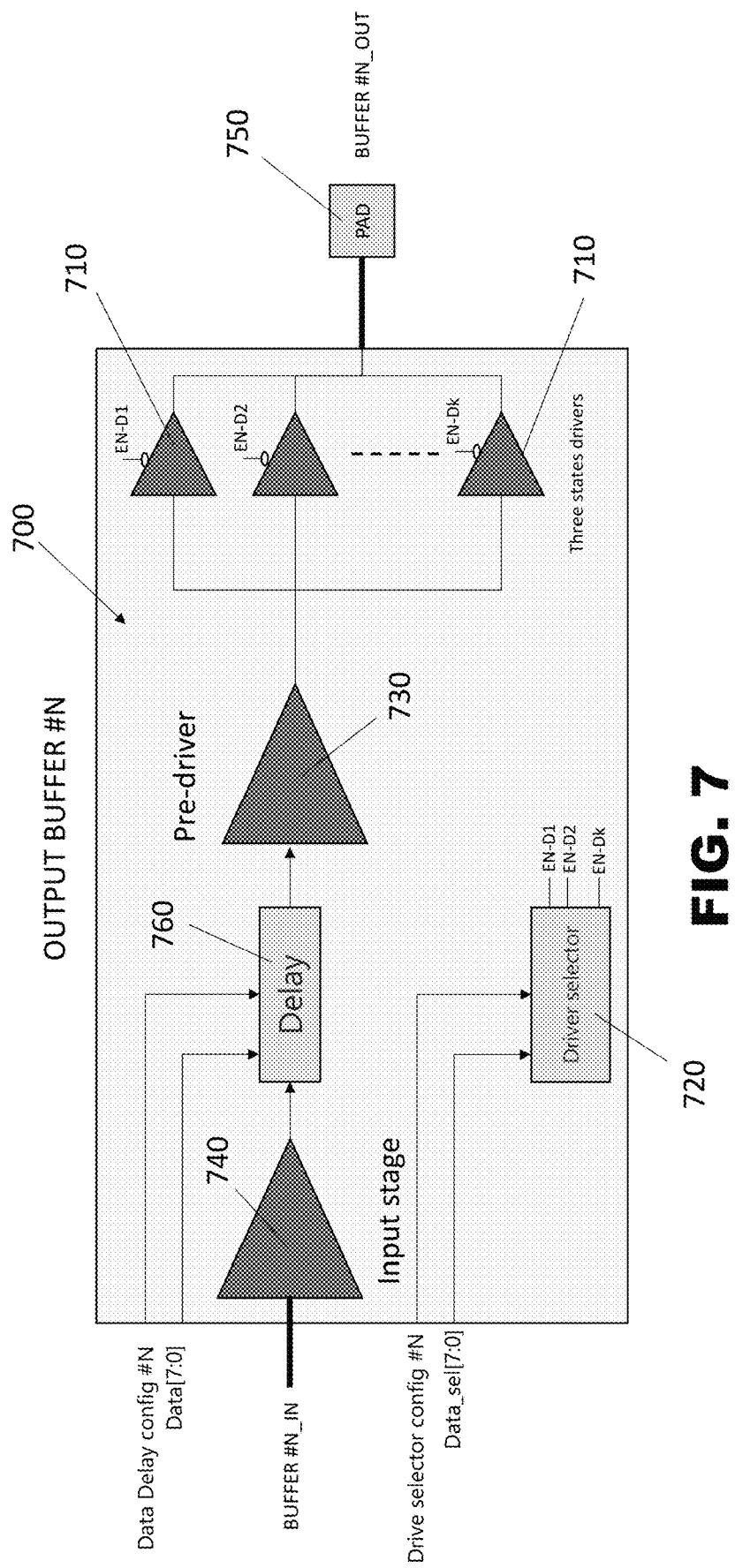
FIG. 7 shows schematically an example of output buffer incorporated into the memory device of the present disclosure and including several three-state drivers.

FIG. 7 represents an example of output buffer 700 incorporated in the memory device of the present disclosure and including as final stages several three-state drivers 710. The output of the stages 710 are addressed to an output pad 750 wherein the output signal BUFFER #N_OUT is available.

Each driver 710 can be selectively chosen by using a driver selector 720. The selection is provided by the input signal Data_sel [7:0] once the selector 720 is enabled by setting a selection signal Drive selector config #N.

The buffer input signal BUFFER #N_IN is received by an input stage 740 that is coupled to the series of drivers 710 through a pre-driver stage 730.

A delay block 760 is coupled between the output of the input stage 740 and the input of the pre-driver stage 730. Similarly, to the example disclosed with reference to FIG. 3, this delay block 760 receives as inputs a first signal Data Delay config #N and a second data signal Data[7:0].

The trimming regulation of output buffer 700 permits to select the right output impedance. The delay block 760 trimming permits to regulate in a fine manner the DATA PATH that is the path of the data from the memory array to the output PAD in order to optimize the setup & hold timing with respect to the SoC clock.

Figure 8:
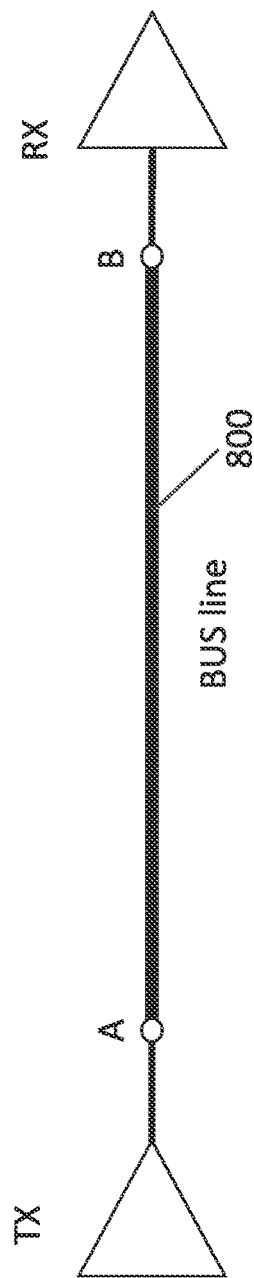
FIG. 8 is a schematic view of a model of a transmission on a wired BUS involving an out buffer of the memory device and another device in communication with the memory.

In this respect, FIG. 8 shows a schematic view of a simple model of a transmission on a wired BUS. The pad 750 shown in FIG. 7 should be considered as coupled to a transmitter TX that can be considered one end A of a communication channel such as a bus line 800. So, the flash array output buffer is in communication with a host device or a SoC through the line 800 and at the opposite end of this line there is a node B representing a receiver RX of the other device connected on the bus.

Figure 9:
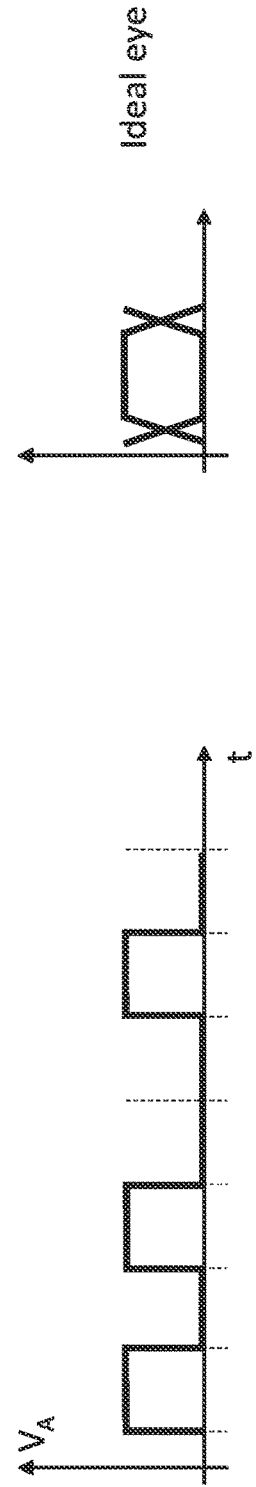
FIGS. 9 and 10 are schematic views of diagrams reporting the voltage vs. time of two opposite nodes A and B at the opposite side of the wired BUS of FIG. 8; those diagrams are the waveform at the output buffer side and at the receiver side as well as the corresponding and related eyes diagram, without and with noise.
Figure 10:
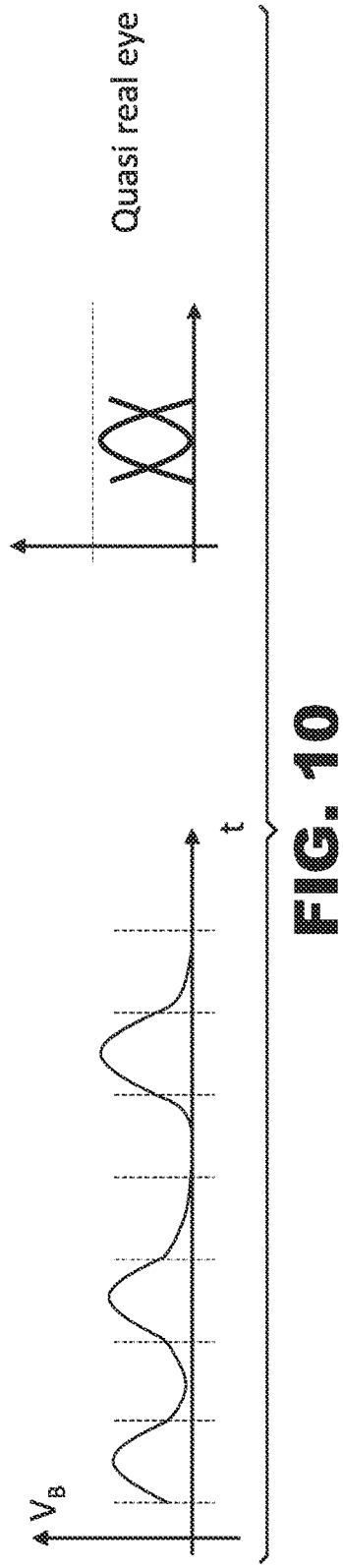
Figure 11:
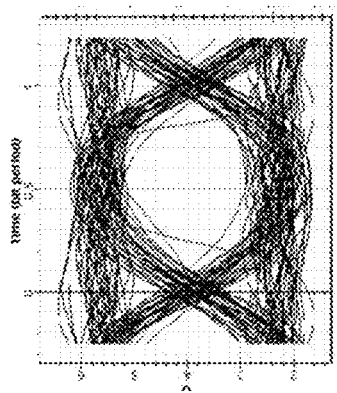
FIGS. 11 and 12 show a real and a schematic diagram representation of an eye diagram relating to the output buffers of the memory device of the present disclosure, respectively.
Figure 12:
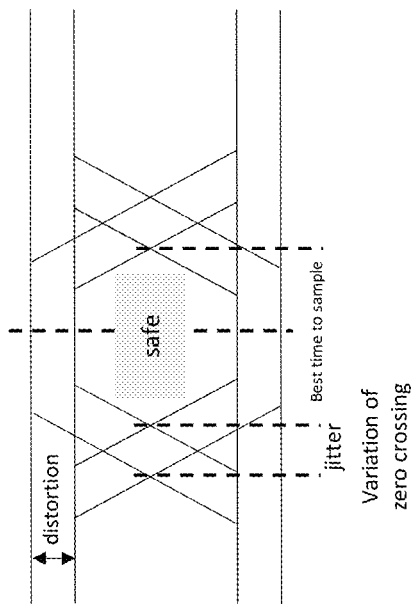

FIGS. 9 and 10 reports on respective schematic views the diagrams of the voltage values vs. time on the two opposite nodes A and B at the opposite side of the wired BUS of FIG. 8.

As may be appreciated, the voltage value Va at the node A is a squared wave form while the resulting transmitted value Vb is sinusoidal waveform.

At one side of each FIGS. 9 and 10 it is reported an eye diagram that is a methodology to represent and analyze a high-speed digital signal. The eye diagram allows key parameters of the electrical quality of the signal to be quickly visualized and determined. The data eye diagram is constructed from a digital waveform by folding the parts of the waveform corresponding to each individual bit into a single graph with signal amplitude on the vertical axis and time on the horizontal axis.

Therefore, the FIGS. 9 and 10 depict the waveform at the output buffer side and at the receiver side as well as the corresponding and related eyes diagram, without and with noise.

From those representations it may be appreciated that FIG. 9 represents an ideal eye diagram while FIG. 10 represents a real (or close to real) eye diagram including distortion, e.g., load-related distortion, and noise.

From those diagrams it is evident that there is an optimum point to sample the output signal of the output buffer and this point is substantially the central portion or box of the eye wherein it is delimited an area where the sample is acceptable Of course, the target of the trimming and tuning phase of the delay or of the impedance is that of having an eye well open that means a sample area relatively wide.

The previously disclosed method is also called calibration and/or training in the DRAM world and in the PCI world, as follows:

1. Compares the value read with the expected ones
   a. If they match the first phase (initial point) is concluded→see point 610 in the diagram of FIG. 6
   b. If some output doesn't match, the configuration is changed up to the moment they match (so step (a) is iterated several times)
2. Once the initial point is done, each configuration is changed in order to find for each the widest interval of functionality—(point 620 in diagram of FIG. 6).

An optimization method to reduce the time to find out the optimal point to use may consider picking the proper values in the look-up table according to one of the following:

Random search (bitwise)
Binary search (bitwise)
Gradient descent; this means data[N−1:0] wise brings to solution space with 2N words.

The same approach can be used for any other parameter inside the device which depends from the Vdd/temperature/process or external condition of the integrated circuit. This could be useful also considering the process aging and when internal parameters re-trimming is desirable.

The method could be substantially the same of the above-disclosed golden pattern stored in the flash internal controller and used as method to find the deviation of the parameters against the known value.

For example, the method can be used also for matching the PCB impedance, in this case the trimming selects different buffer Zout and the feedback for the trimmer is the reflected signal.

Making now reference for instance to a retrimming due to a thermal drift, it is not important to detect the real temperature value at whom the reading phase is performed. Such a temperature could be higher (even much higher) or lower if compared to the level of temperature at whom the programming phase has been performed. The issue here is that the change of the temperature will generate a virtual drift and enlarge of the internal level distribution. This drift and enlarge can generate errors due to overlapping of the distribution. This effect is worst when the device is aged since the distribution are starting already enlarged vs when they are new With the method of the present disclosure the system would be automatically protected by any thermal drift since the trimming parameters are selected after having performed the correct reading of the known sequence stored in the dummy row 300 and having identified accordingly the trimming parameter contained in the programmable or trimmable register and adopted for reading the same known value at different temperatures or with different reference voltage values.

The procedure allowing to identify the more suitable reading trimming parameters for a correct retrimming phase at a certain temperature value are not necessarily repeated with a great periodicity. The procedure is executed when the external SoC wants and/or when a high ECC level is detected during the read operations.

On the contrary, such a procedure may be performed periodically or, in a more appropriate manner, when possible problems are detected by the ECC bits.

It happens for instance that an increased number of ECC bits (The array ECC can be different from the safety one as per previous comment) are reporting an excessive number of wrong reading from the memory device. In such a case, the system may automatically start the procedure for detecting a possible thermal drift and a consequent need to change the trimming parameters.

In some case the procedure may be carried out in response to a variation of external conditions such as detection of a temperature or a voltage supply change by corresponding sensors in a vehicle, for example.

The architecture and method of the present disclosure has several evident advantages. For example, it is provided the possibility to follow the any thermal drift of the environment in which the memory device or the system of the memory device is embedded. This is linked to the optimum settings. Additionally, programmability of the system is provided since the dummy row 300 wherein the known value is recorded may be deleted and re-programmed according to the needs, so even according to an environmental change for the memory device. Because the 0x55 can be retrieved from the internal flash controller as location and pattern, while the look-up table can arrive from another sub-array in this implementation.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

The invention claimed is:

1. A method, comprising:
in response to not finding operating parameters corresponding to a present operating temperature or reference voltage in a programmable or trimmable register:
setting the operating parameters of an integrated circuit for self trimming an internal timing of the integrated circuit including a circuit portion receiving a data stream on a data input and a clock signal on a clock input,
wherein setting the operating parameters comprises aligning in time the clock signal with the data stream by operation of a programmable or trimmable delay element or circuit before one or both of said inputs, and
recording the operating parameters with respect to the present operating temperature and reference voltage in the programmable or trimmable register.

2. The method of claim 1, further comprising establishing operative conditions when the integrated circuit is new from a factory.

3. The method of claim 1, wherein aligning in time comprises operating the programmable or trimmable delay element or circuit upstream of the clock input to modify a relative distance between the data stream and an active or front edge of the clock signal.

4. The method of claim 1, wherein aligning in time comprises operating the programmable or trimmable delay element or circuit upstream of the data input to modify a relative distance between the data stream and an active or front edge of the clock signal.

5. The method of claim 1, wherein aligning in time comprises regulating the programmable trimmable delay element or circuit to re-set a timing difference between a sampling clock signal and a sampling data signal.

6. The method of claim 1, wherein aligning in time comprises regulating a set-up time interval of said circuit portion.

7. The method of claim 1, wherein aligning in time phase comprises regulating a hold time interval of the circuit portion.

8. The method of claim 1, wherein aligning in time comprises regulating the programmable or trimmable delay element or circuit by a configuration signal.

9. The method of claim 1, wherein the aligning in time comprises regulating the programmable or trimmable delay element or circuit by a delay chain.

10. A device, comprising:
a logic element receiving a data stream on a data input and a clock signal on a clock input;
a programmable or trimmable delay element or circuit upstream to the data input or the clock input; and
a trimmer block including a first input to indicate an operating temperature and a second input to indicate a reference voltage;
wherein the device is configured, in response to receiving an indication of an operating temperature change or a reference voltage change, to:
look up self trim operating parameters in a programmable or trimmable register corresponding to the indicated operating temperature and reference voltage; and
in response to not finding the self trim operating parameters corresponding to the present operating temperature and reference voltage, cause the programmable or trimmable delay element or circuit to:
self trim the internal timing of the logic element by aligning in time at least one of the clock signal or the data stream; and
record the self trim operating parameters with respect to the indicated operating temperature and reference voltage in the programmable or trimmable register.

11. The device of claim 10, wherein the programmable or trimmable delay element or circuit is on a clock signal path upstream with respect to the clock input.

12. The device of claim 10, wherein the programmable or trimmable delay element or circuit is on a data stream path upstream with respect to the data input.

13. The device of claim 10, wherein the programmable or trimmable delay element or circuit is configured to re-set a timing difference between a sampling clock signal and a sampling data signal.

14. The device of claim 10, wherein the programmable or trimmable delay element or circuit is configured to adjust a setup time interval of the logic element.

15. The device of claim 10, wherein programmable or trimmable delay element or circuit is configured to adjust a hold time interval of the logic element.

16. The device of claim 10, wherein the programmable or trimmable delay element or circuit has an input configured to receive a configuration signal.

17. The device of claim 10, wherein the programmable or trimmable delay element or circuit comprises a delay chain.

18. A device, comprising:
pads to communicate external to the device;
an array of memory cells with decoding and sensing circuitry;
output buffers coupled to the array of memory cells and including a plurality of selectable final output stages coupled to the pads;
a driver selector in the output buffer to select among the plurality of selectable final output stages for selecting an output impedance of the output buffer; and
a programmable or trimmable delay element or circuit in the output buffer upstream to the plurality of selectable final output stages for fine tuning the output impedance of the output buffer.

19. The device of claim 18, wherein the programmable or trimmable delay element or circuit is configured to regulate a path of the data from the array of memory cells to the pads.

* * * * *